(12) United States Patent
Vanier

(10) Patent No.: US 7,778,293 B2
(45) Date of Patent: Aug. 17, 2010

(54) DETERMINING AND SETTING THE FREQUENCY MODULATION INDEX OF A LASER IN A CPT FREQUENCY STANDARD

(75) Inventor: Jacques Vanier, Notre Dame de l'Ile Perrot (CA)

(73) Assignee: Kernco Inc., Danvers, MA (US)

( * ) Notice: Subject to any disclaimer, the term of this patent is extended or adjusted under 35 U.S.C. 154(b) by 611 days.

(21) Appl. No.: 10/560,462

(22) PCT Filed: Jun. 18, 2004

(86) PCT No.: PCT/US2004/019695

§ 371 (c)(1),
(2), (4) Date: Dec. 14, 2005

(87) PCT Pub. No.: WO2005/012925

PCT Pub. Date: Feb. 10, 2005

(65) Prior Publication Data

US 2008/0317075 A1    Dec. 25, 2008

Related U.S. Application Data

(60) Provisional application No. 60/479,687, filed on Jun. 19, 2003.

(51) Int. Cl.
*G02F 1/35* (2006.01)
*G02F 1/25* (2006.01)

(52) U.S. Cl. ........................................... 372/28

(58) Field of Classification Search ............... 372/28
See application file for complete search history.

(56) References Cited

U.S. PATENT DOCUMENTS

| 5,959,658 | A * | 9/1999 | Gnauck et al. ............... 725/151 |
| 6,320,472 | B1 | 11/2001 | Vanier |
| 6,363,091 | B1 | 3/2002 | Zhu |

* cited by examiner

*Primary Examiner*—Michael B Shingleton
(74) *Attorney, Agent, or Firm*—Gordon E. Nelson (57) ABSTRACT

A technique for determining the modulation index of a frequency-modulated laser source from the absorption spectrum that is produced when light from the laser passes through an alkali metal vapor cell. The absorption spectrum contains a primary minimum and a number of satellite minima and the modulation index is determined using ratios of the minima. The technique is used to calibrate the laser source of a CPT frequency standard so that it operates at a desired modulation index. Ways are disclosed of using the technique to calibrate the CPT frequency standard either manually or automatically. The calibration may be done when the CPT frequency standard is built, when the frequency standard is initialized, or during normal operation of the CPT frequency standard.

15 Claims, 13 Drawing Sheets

DETERMINING AND SETTING THE FREQUENCY MODULATION INDEX OF A LASER IN A CPT FREQUENCY STANDARD

CROSS REFERENCES TO RELATED APPLICATIONS

The present patent application claims priority from U.S. provisional patent application 60/479,687, Jacques Vanier, Determining the frequency modulation index of a laser in a CPT frequency standard, filed Jun. 19, 2003. It further incorporates U.S. Pat. No. 6,320,472, Jacques Vanier, Atomic Frequency Standard, issued Nov. 20, 2001, by reference for all purposes.

BACKGROUND OF THE INVENTION

1. Field of the Invention

The present invention relates generally to high-precision frequency standards, or as they are more popularly termed, "atomic clocks", and more specifically to frequency standards that employ coherent population trapping, or CPT.

2. Description of Related Art

Timekeeping devices work by keeping track of the number of times a phenomenon that has a regular period occurs. With pendulum clocks, the regular phenomenon is the swing of the pendulum; with clocks that run on alternative current (AC), it is the cycles of the AC; with clocks that employ quartz crystals, it is the internal vibrations of the quartz crystal.

The most precise clocks are the so-called atomic clocks. In these clocks, the phenomena with the regular period involve atoms that make transitions between two energy levels at angular frequency $\omega_o$. In most atomic clocks realized up to now using alkali metal atoms, these energy levels are part of the ground state of the atoms. The angular frequency $\omega_o$ involved in these transitions is called the resonance angular frequency and is in the microwave range (Gigahertz range). The transitions can be detected by several means and among others through emission or absorption of energy at the resonance frequency, or when excited at that resonance frequency, by means of effects on a light beam interacting with the same atoms.

The kind of atomic clocks, or more formally, frequency standards, which are of interest in the present context are frequency standards based on the phenomenon of coherent population trapping (CPT). In coherent population trapping, the atoms are subjected to optical radiation at two angular frequencies $\omega_1$ and $\omega_2$ connecting the two levels of the ground state to a third level called the excited state. When the difference frequency $(\omega_1-\omega_2)$ is exactly equal to the atoms' resonance frequency $\omega_o$ in the ground state, the atoms cannot absorb the electromagnetic radiation or in other words be excited to the excited state. As a consequence, there is no diminution in the optical radiation as it passes through the trapped atoms; also, because none of the trapped atoms can enter the excited state, there is no emission of electromagnetic radiation from the atoms and consequently no fluorescence. When the frequency difference $(\omega_1-\omega_2)$ of the optical radiation fields is not exactly equal to the ground state resonance frequency $\omega_o$, the atoms are not trapped in the ground state. They can absorb energy from the optical radiation fields, enter the excited state and emit fluorescence. The resonance phenomenon in the ground state at frequency $\omega_o$ is thus observed directly on the transmitted radiation or fluorescence as a change in intensity. In practice fluorescence is undesirable since it causes incoherent optical pumping. For this reason, nitrogen, which causes decay of the atoms from the excited state without fluorescence, or in other words causes quenching of fluorescence, is used as a buffer gas as will be described below. Thus in practice the CPT effect is detected in transmission.

Figure 1:
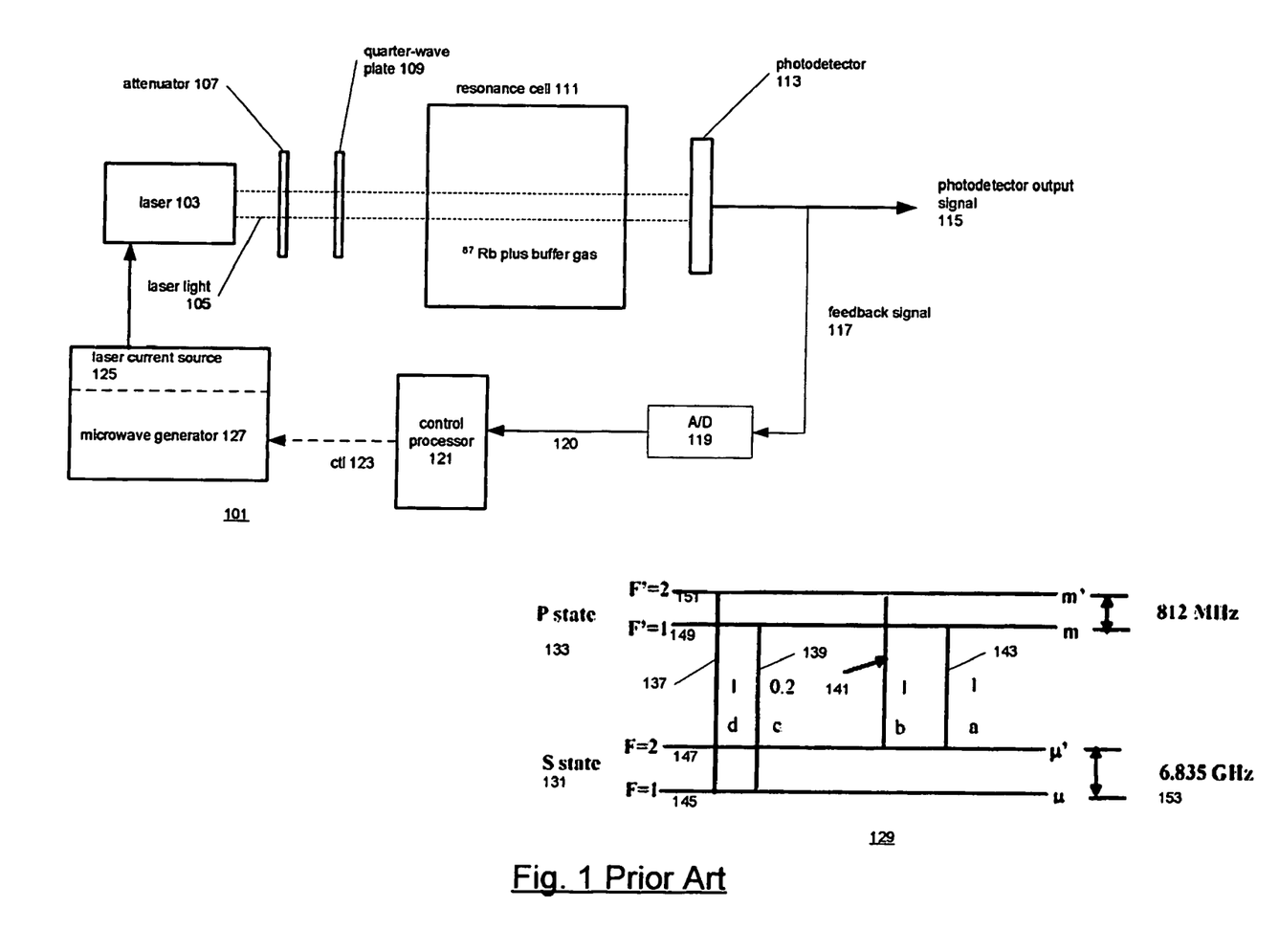
FIG. 1 is a block diagram of a frequency standard that employs coherent population trapping.

FIG. 1 is a block diagram of a CPT frequency standard 101 of the type disclosed in U.S. Pat. No. 6,320,427, cited in the Cross references to related applications. At the highest level, frequency standard 101 works as follows: The current source 125 driving laser 103 is modulated by microwave generator 127 at frequency $\omega_o/2$. This has the effect of creating, in the output spectrum of the laser, sidebands spaced symmetrically on each side of the laser carrier frequency. These sidebands are separated by $\omega_o/2$ and their amplitude is given by Bessel functions $J_n$. The two first sidebands called $J_{1+}$ and $J_{1-}$ situated on each side of the carrier are thus separated by the frequency $\omega_o$. They are the sidebands used as the two radiation fields at $\omega_1$ and $\omega_2$. Under the excitation of these two sidebands, the atoms are trapped in the ground state, they cannot absorb the light from the laser and virtually all of the light passes through resonance cell 111 to photodetector 113; when $(\omega_1-\omega_2)$ is not equal to $\omega_o$ the atoms are not trapped in the ground state, much more of the light is absorbed by the atoms in resonance cell 111 and much less light reaches photodetector 113. Photodetector 113 produces a current which is proportional to the amount of light that falls on it, and the current from photodetector 113 thus indicates when $(\omega_1-\omega_2)$ is equal to $\omega_o$ or not.

Microwave generator 127 is modulated at a low frequency causing the frequency separation $(\omega_1-\omega_2)$ to vary periodically by a small amount and causing at the same time a low frequency periodic variation of the optical radiation at photodetector 113. This periodic variation is processed as indicated below to lock the microwave generator to the atomic resonance at $\omega_o$.

In more detail, resonance cell 111 contains an alkali-metal vapor which is buffered by chemically inert gases to avoid Doppler effect and relaxation of the atoms on the cell walls, which broadens the resonance line as well as to quench the fluorescence. Nitrogen is a preferred buffer gas for this effect. In a preferred embodiment, the alkali vapor is rubidium 87 ($^{87}$Rb). Before the laser light 105 enters resonance cell 111, it is attenuated by attenuator 107 and circularly polarized by quarter-wave plate 109. The frequency of the sidebands of the frequency-modulated light output from laser 103 is controlled by feedback signal 117 from photodetector output signal 115. This is done by modulating by a small amount the frequency of the microwave generator and using digital synchronous detection techniques. Feedback signal 117 is digitized by A/D converter 119 to produce signal 120. Signal 120 is received by control processor 121, which uses the feedback to derive control signals 123 for microwave generator 127, which generates the microwave frequency by which the frequency of laser 103 is modulated. The microwave frequency is applied to laser current source 125, which provides current to laser 103. In this implementation the microwave generator is locked in frequency to the atomic resonance $\omega_o$ as determined from photodetector output signal 115. The frequency standard produced by clock 101 is derived from the locked frequency of the microwave generator.

As indicated above, the CPT phenomenon depends on the proper high frequency modulation of the frequency of laser 103. The modulation required is in turn determined by the energy level structure of the alkali metal atoms. The energy level structure of $^{87}$Rb is shown at 129. The ground state is S state 131; the excited state is P state 133. The hyperfine levels F=1 and F=2 of ground state 131 are shown at 145 and 147; the hyperfine levels F'=1 and F'=2 of the excited state are shown at 149 and 151.

In the case of hyperfine levels 145 and 147, the difference in energy corresponds to a frequency of 6.835 GHz, as shown at 153. This is the atom ground state resonance frequency, $\omega_o/2\pi$, used in the implementation of the CPT Rb$^{87}$ frequency standard. Other alkali metal atoms have different resonance frequencies and can also be used. Referring to FIG. 1, the preferred frequencies in the present embodiment are those corresponding to the transitions 137 ($\omega_1$) and 141 ($\omega_2$). If the difference frequency ($\omega_1-\omega_2$) is equal to $\omega_o$, the atoms in ground state 131 are trapped in that state and cannot make a transition to excited state 133. As indicated above, the transitions are caused by photons from laser 103, and when a photon causes a transition, it is absorbed by resonance cell 111 and does not reach photodetector 113. When the atoms cannot make the transitions, resonance cell 111 absorbs very little of laser light 105 and almost all of it reaches photodetector 113. In system 101, the two frequencies necessary to produce CPT are produced by modulating the current source of laser 103 at a microwave frequency which is ½ of frequency 153. Another technique consists in using an electrooptic modulator (EOM) placed directly in the light beam 105 and driven by a microwave generator similar to 127.

In such cases the spectrum of the modulated laser contains sidebands whose amplitudes are determined by Bessel functions as explained above. The two first sidebands $J_1$ are those used in the detection of the CPT phenomenon and the size of the detected resonance signal is a function of their amplitude. On the other hand, the so-called light shift, affecting the resonance frequency $\omega_o$ and the precision of the frequency standard, is a function of the amplitude of all the sidebands contained in the laser spectrum. These amplitudes depend on the microwave power applied on the current source driving the laser. The amplitude of all these sidebands is characterized by the so-called modulation index m which is a measure of the depth of modulation. For example for maximum $J_1$'s the modulation index must be set at m=1.8, while for minimum light shift the modulation index must be set at m=2.4. It is thus important to have control on this modulation index depending on the condition desired.

A problem in making frequency standards 101 has been that the standard technique for determining the modulation index of light 105 produced by a laser has been the need to remove the laser from the frequency standard and/or use a specialized optical spectrum analyzer to determine the laser's modulation index. Under even the best of circumstances, this procedure is time consuming and fraught with all of the risks involved in removing and reinstalling a component of a precision device. However, one of the great advantages of frequency standards like frequency standard 101 is their small size; current versions in which the whole device is 7 cm. long have been produced and versions which are 4.2 mm long and 1.5 mm square, and thus small enough to be a component of an integrated circuit, are under discussion. As the frequency standards become smaller, it becomes ever more difficult and finally impossible to remove the laser to determine its modulation index. What is needed, and what is provided by the present invention, is a technique for determining the modulation index of the laser without removing the laser from the frequency standard. It is thus an object of the invention to provide such a technique.

SUMMARY OF THE INVENTION

The object of the invention is attained by means of a general technique for using the amount of laser light which passes through the alkali metal vapor cell to determine the modulation index. The amount of laser light is of course measured by the photodetector, and the general technique thus makes it possible to use the output from the photodetector to determine the modulation index of the laser and thereby to determine the modulation index without removing the laser from the frequency standard.

In the general technique, the laser light is modulated at a given power and a given frequency and then passes through the alkali metal vapor cell. The modulation index is then determined from the absorption spectrum of the light that has passed through the alkali metal vapor cell. The absorption spectrum includes a number of minima and the modulation index is determined from the minima. The minima may be detected by the photodetector.

The modulation index is determined from ratios of the minima. In one embodiment, a ratio of first ones of the minima ambiguously determines the modulation index and a ratio of second ones of the minima disambiguates the determination.

The minima include a primary minimum and first, second, and third satellite minima. The minima may be determined by ratios of the primary minimum and the first satellite minimum or by ratios of the first and second satellite minima. Disambiguation is done using the ratio of the second and third satellite minima.

The general technique may be employed to calibrate a frequency-modulated laser source in a CPT frequency standard to run at a desired modulation index. The CPT frequency standard may be calibrated automatically and the calibration may be done on initialization of the frequency standard or during normal operation of the frequency standard.

Other objects and advantages will be apparent to those skilled in the arts to which the invention pertains upon perusal of the following Detailed Description and drawing, wherein:

Reference numbers in the drawing have three or more digits: the two right-hand digits are reference numbers in the drawing indicated by the remaining digits. Thus, an item with the reference number 203 first appears as item 203 in FIG. 2.

DETAILED DESCRIPTION

The following Detailed Description will first present an overview of a technique for determining the modulation index of laser 103 from photodetector output signal 115, will then provide empirical details of the effect of changing the modulation index of laser 103 on photodetector output signal 115, will show how characteristics of photodetector output signal 115 may be used either to set the laser's modulation index by hand or to set it automatically, and will finally show how the results of a theoretical determination of the characteristics of photodetector output signal 115 may be used to automatically set the laser's modulation index.

Figure 2:
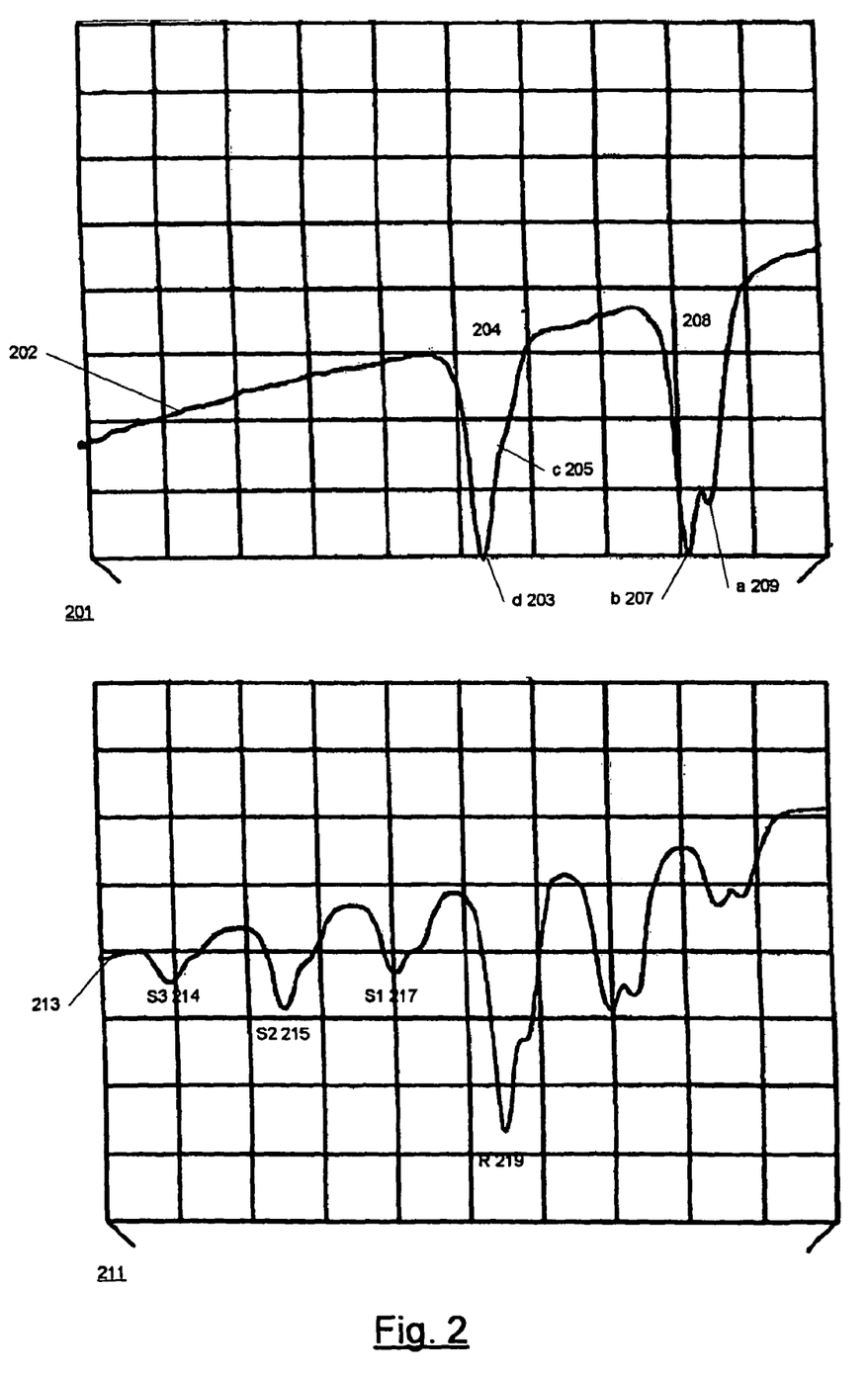
FIG. 2 shows the effect of optical absorption on signal 115 for a non-modulated laser (201) and for a laser modulated at ~$\omega_o/2$ (211)
Figure 3:
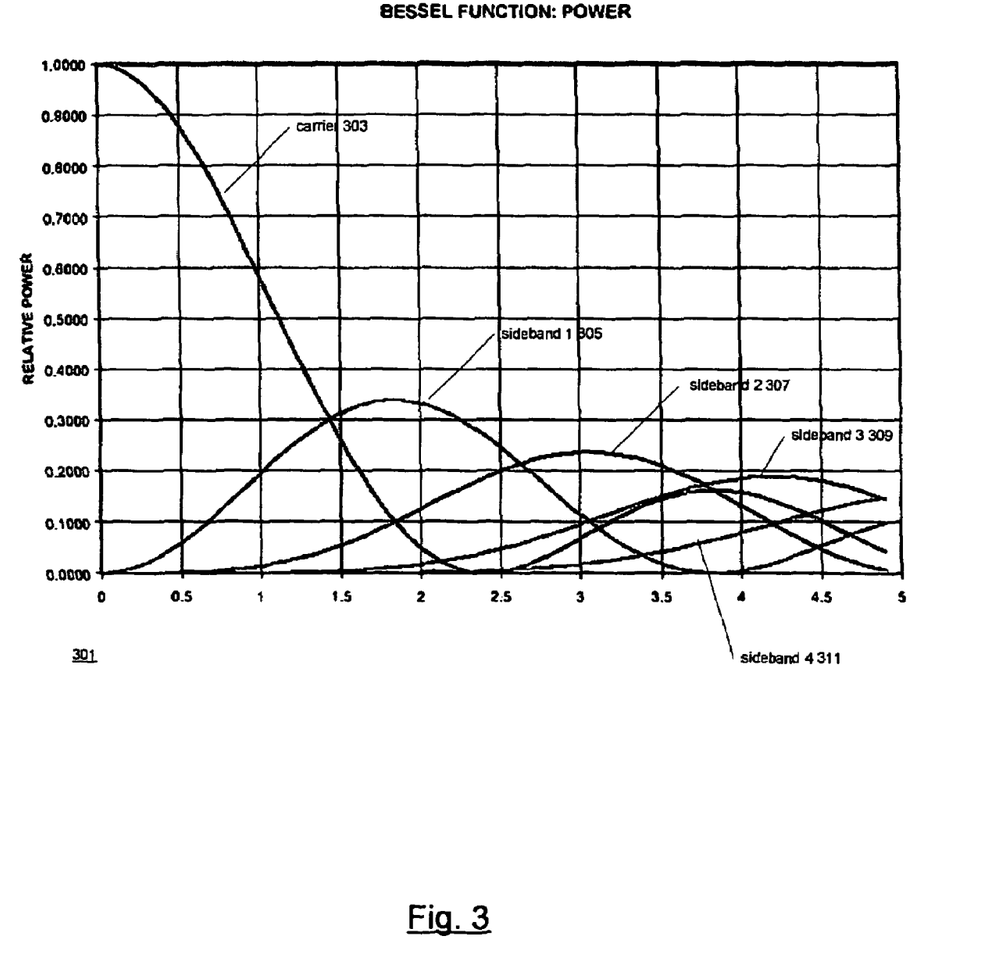
FIG. 3 shows the intensity of the sidebands produced by frequency modulation; each sideband 1, 2 3, is double and the pairs of sidebands are distributed symmetrically on each side of the carrier 303.

A Technique for Determining the Modulation Index of Laser 103 from Photodetector Output Signal 115: FIGS. 2-3

If the modulation index of laser 103 can be determined from photodetector output signal 115, there will be no need to remove laser 103 from frequency standard 101 or use a specialized instrument such as a Fabry-Perot interferometer to determine laser 103's current modulation index. Further, since feedback signal 117 provides photodetector output signal 115 to control processor 121, control processor 121 can control microwave generator 127 to produce a microwave signal which gives laser light 105 the best modulation index.

Plot 201 of FIG. 2 shows the effect on photodetector output signal 115 if the wavelength of an unmodulated laser is slowly swept across the hyperfine resonances of the D1 line of rubidium 87. Photodetector output signal 115 traces out pattern 202 of FIG. 2. The large dips 204 and 208 in the current of photodetector output signal 115 are the results of the possible state transitions shown in FIG. 1. When a state transition is possible, resonance cell 111 absorbs laser light 105 and a dip in the current of photodetector output signal 115 results. In FIG. 2, the dips have been correlated with the transitions shown at 129 in FIG. 1; thus, the dip at d 203 corresponds to transition d 137, the almost nonexistent dip at c 205 corresponds to low probability transition c 139, the dip b 207 corresponds to transition b 141, and dip a 209 corresponds to transition a 143. In the following, the dips will be termed minima of photodetector output signal 115.

Plot 213 shows the effect on photodetector output signal 115 if laser source 103 is modulated at approximately one-half the hyperfine separation 153 shown in FIG. 1 and is then slowly swept across the hyperfine resonances as described above. When laser source 103 is modulated, the result is the production of sidebands as shown in FIG. 3. The sidebands are at frequencies above and below the carrier frequency of laser source 103, which is the frequency of laser source 103 prior to modulation. Plot 301 shows the power of carrier 303 and sidebands 1 305 through 4 311. Because the laser is now modulated, not only the laser's wavelength, but also all of the sidebands produced by the modulated laser, are swept over the hyperfine resonances.

Experimental plot 213 is in principle the result of the convolution of the modulated laser spectrum with the hyperfine absorption spectrum. The deepest minimum is at R 219, and this dip is the result of the absorption of laser light 105 by transitions caused by the two first sidebands $J_1+$ and $J_{1-}$; it will be termed in the following the primary minimum. The other dips are termed satellite minima; they are the result of the absorption of laser light 105 by transitions caused by combinations of the sidebands and of the carrier. Thus, S1 217 corresponds to sideband 2 307 and carrier 303; S2 215 corresponds to sideband 3 209 and sideband 1 305. As will be explained in detail in the following, the current modulation index of laser light 105 may be determined from either the ratio of the value of plot 213 at primary minimum R 219 to the value of plot 213 at satellite minimum S1 217 or the ratio of the value of plot 213 at satellite minimum S1 217 to the value of plot 213 at satellite minimum S2 215.

Because plot 213 of photodetector output signal 115 contains information from which the current modulation index of laser light 105 may be determined, the current modulation index of laser 103 may be determined without removing laser 103 from frequency standard 101, and/or using a specialized instrument such as a Fabry-Perot interferometer, and the power of the signal by which laser 103 is modulated may be modified in a way that produces the modulation index required for the best performance of frequency standards of the type of frequency standard 101. One way of doing this is manually; another is to have control processor 121 do it automatically. It should be noted here that the technique for determining the modulation index will work not only with alkali metal vapor cells that employ rubidium, but also with those that employ other alkali atoms such as cesium. The frequency modulation applied to the laser must of course be that required for the resonance angular frequency of cesium or the other alkali atom selected.

Manual Adjustment of the Index of Modulation of Laser 103: FIG. 4A-4G

If plot 213 produced by the modulation index that gives the best performance of frequency standard 101 is known, plot 213 produced by the current modulation index can be compared with the plot for the desired modulation index, and microwave generator 127 can be hand adjusted in the direction required to achieve the desired modulation index. Experience has shown that the modulation index can be adjusted in this fashion to within about 10% of the most desirable value.

How a series of plots 213 provide the necessary information for such manual adjustments is shown in FIGS. 4A through 4G, which show theoretical plots similar to 213 of photodetector output signal 115 made at modulation indexes ranging from 1.2 through 3.0. Each plot 401 through 427 plots the intensity of the radiation transmitted by resonance cell 111 against the change in frequency of laser light 105 for a given modulation index. The modulation index is indicated as m= in the upper left-hand corner of the plot.

Figure 4A:
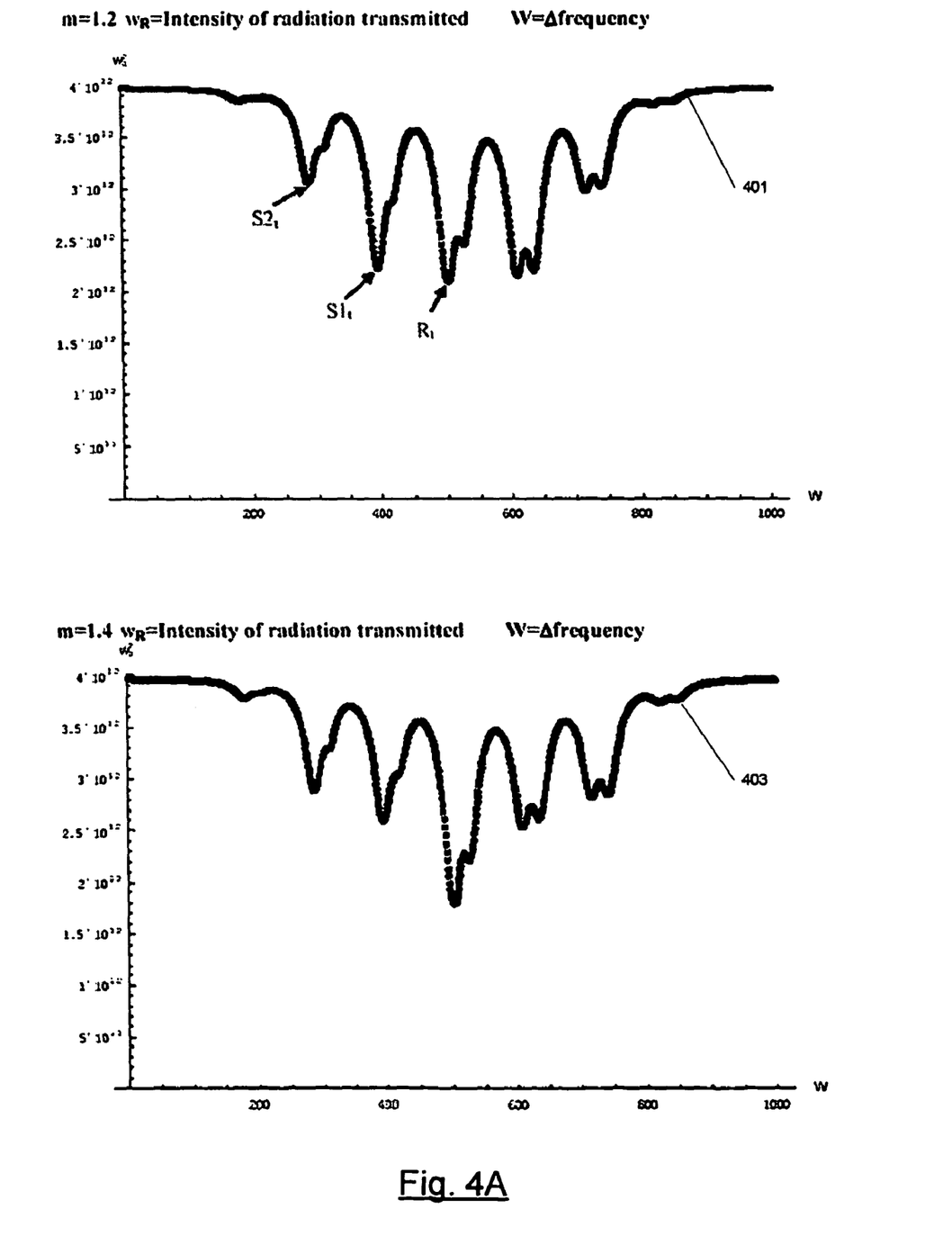
FIG. 4 shows the effect of changes in the modulation index on photodetector output signal 115.
Figure 4B:
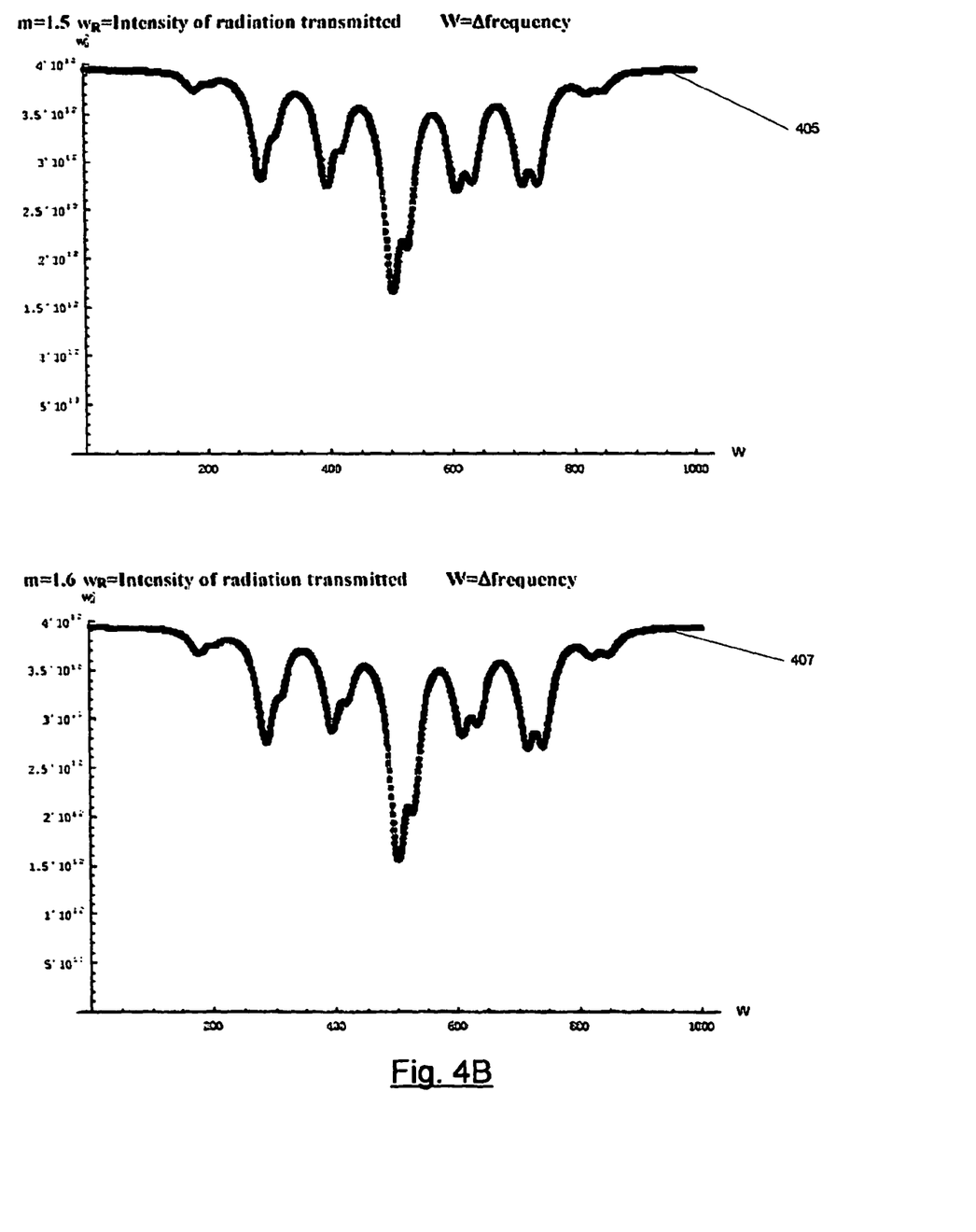
Figure 4C:
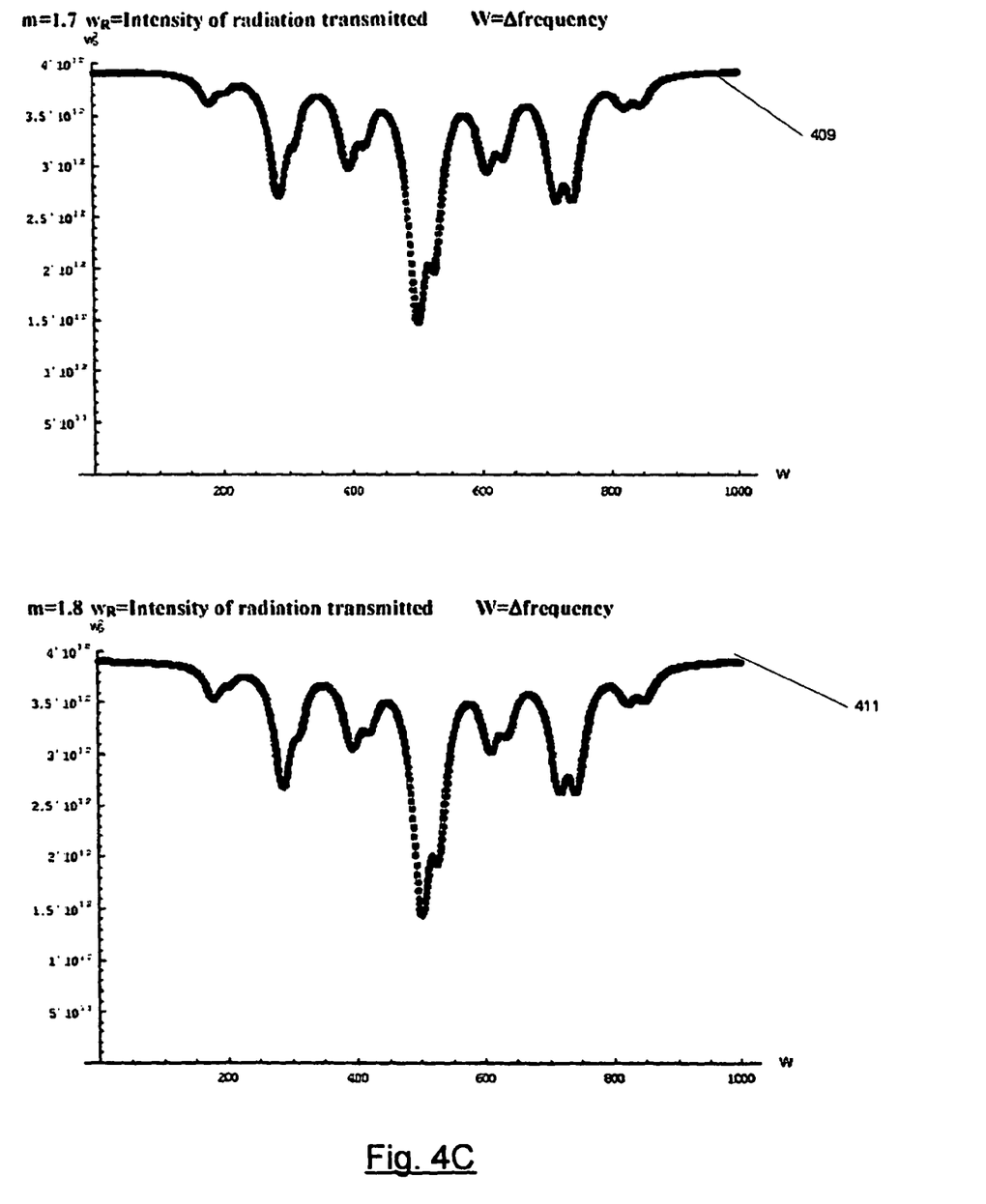
Figure 4D:
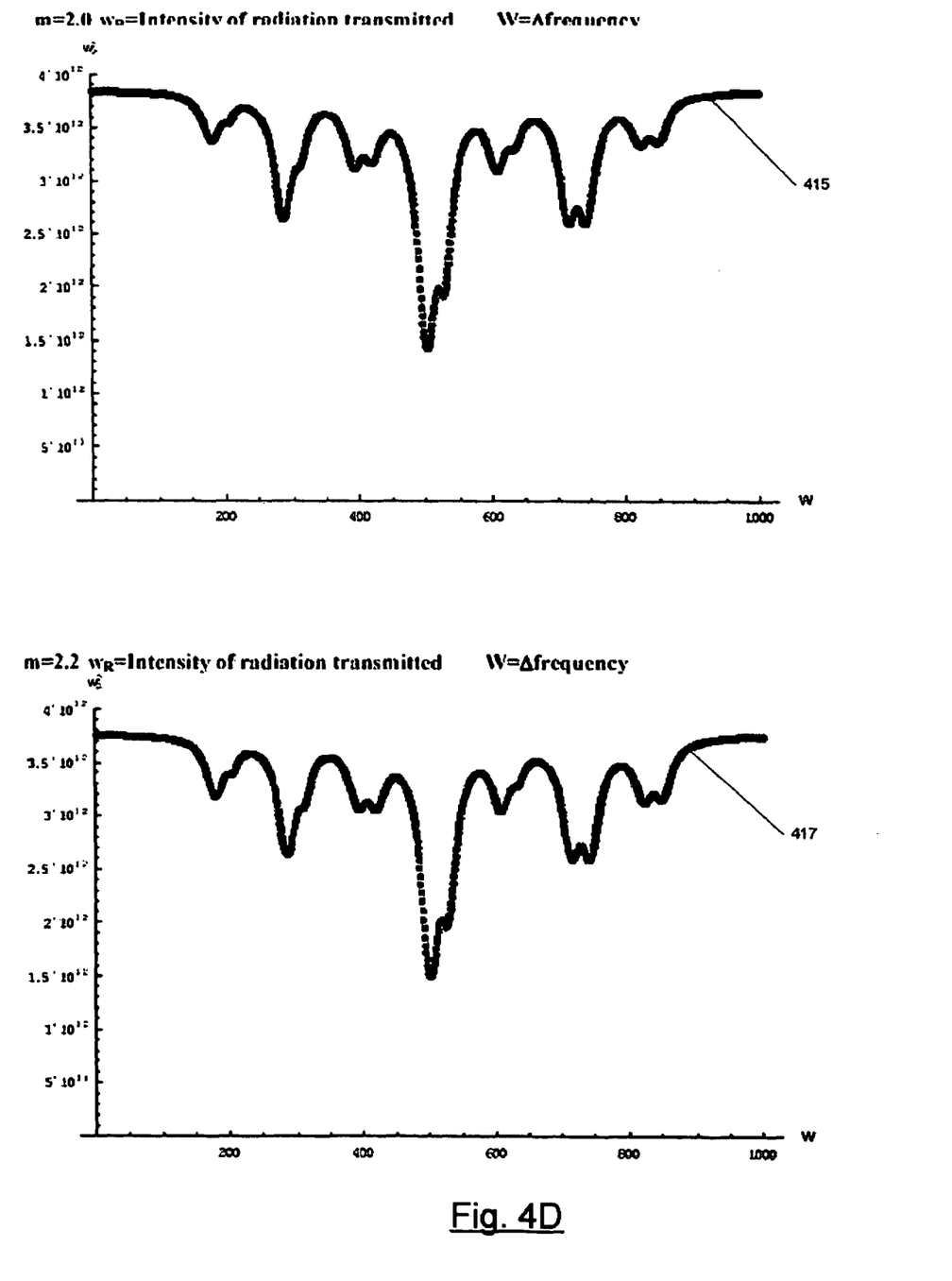
Figure 4E:
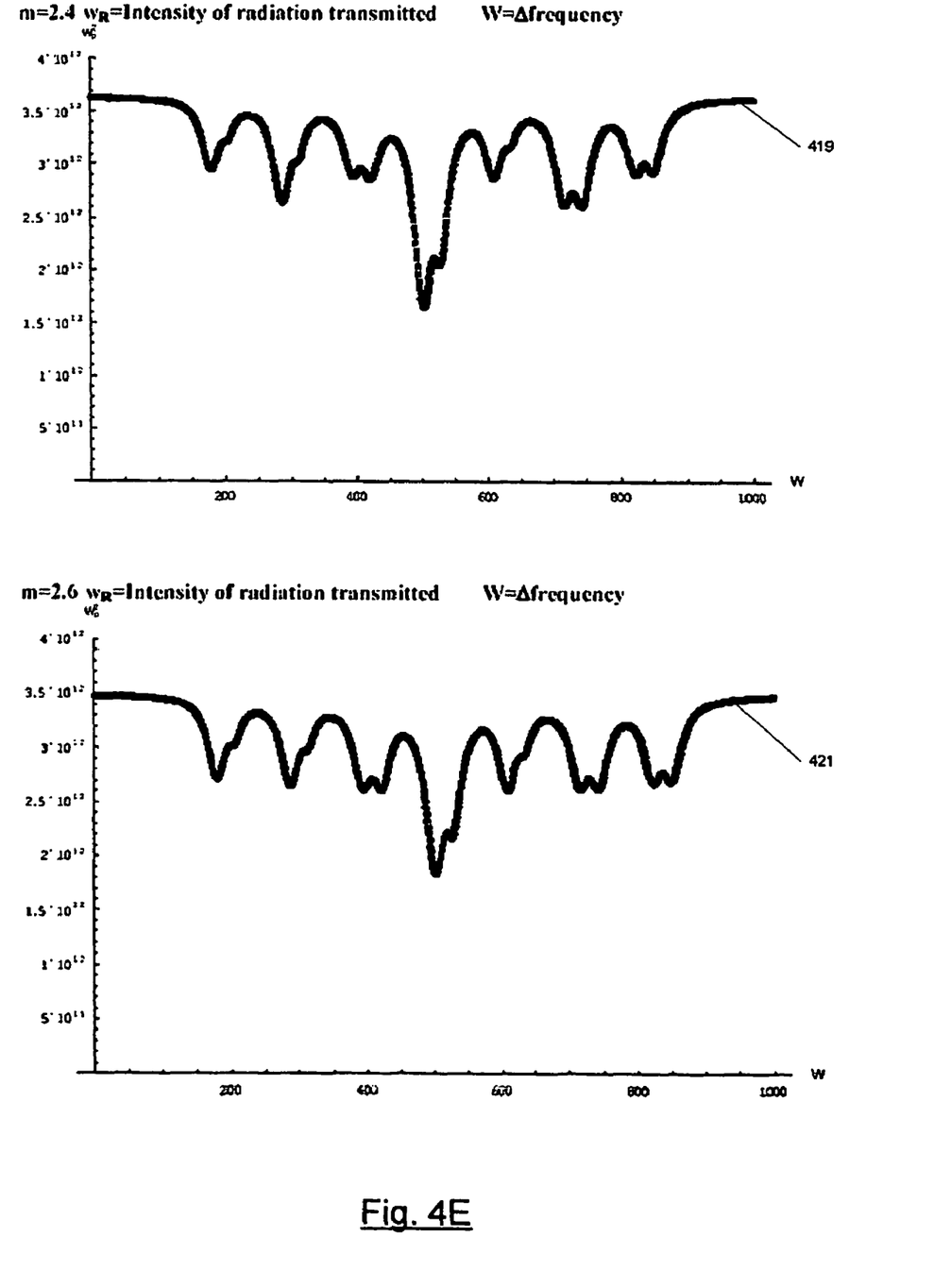
Figure 4F:
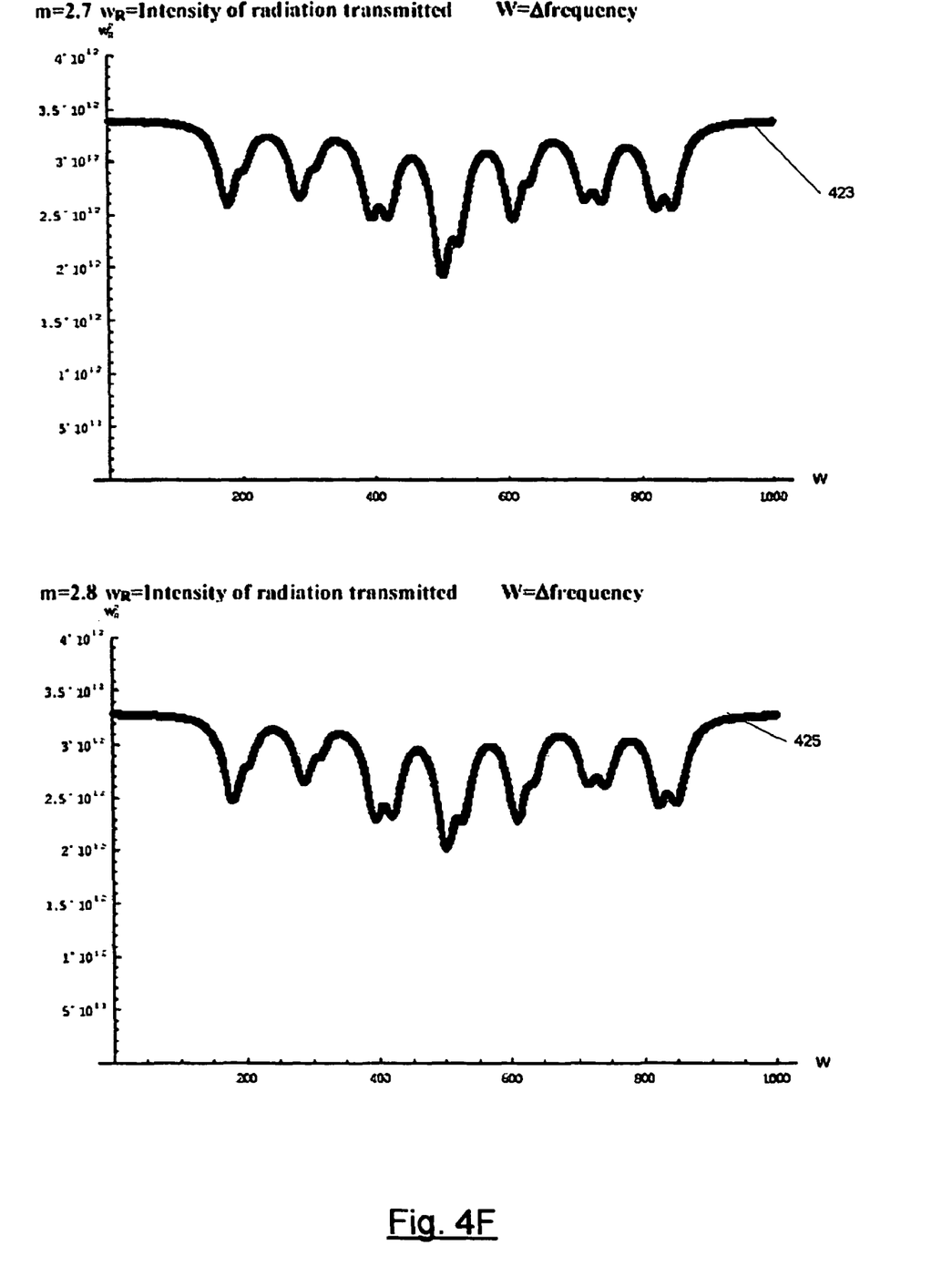
Figure 4G:
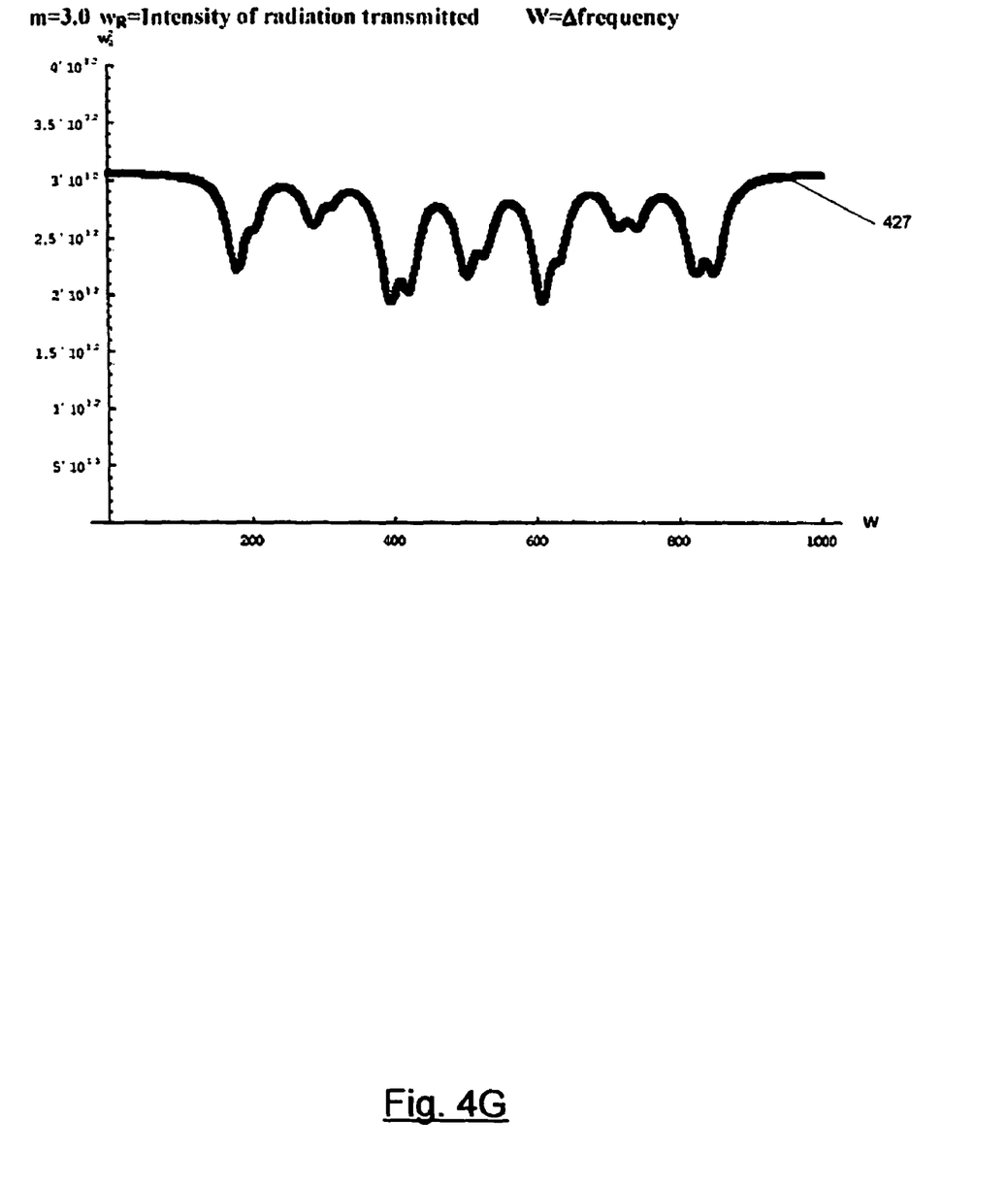

An interesting modulation index is 1.8, which maximizes the amplitude of the sidebands $J_1$ and thus maximizes the CPT signal amplitude with minimum laser power. Plot 411 for modulation index 1.8 is shown in FIG. 4C. If the plots in FIGS. 4A-4C are compared, it will be seen that manual adjustment may be done by adjusting the modulation of laser 103 while watching the plot of photodetector output signal 115 in an oscilloscope until the plot closely approximates plot 411. Another interesting value for the modulation index is 2.4, which makes the power light shift for such a setting equal to 0.

Figure 5:
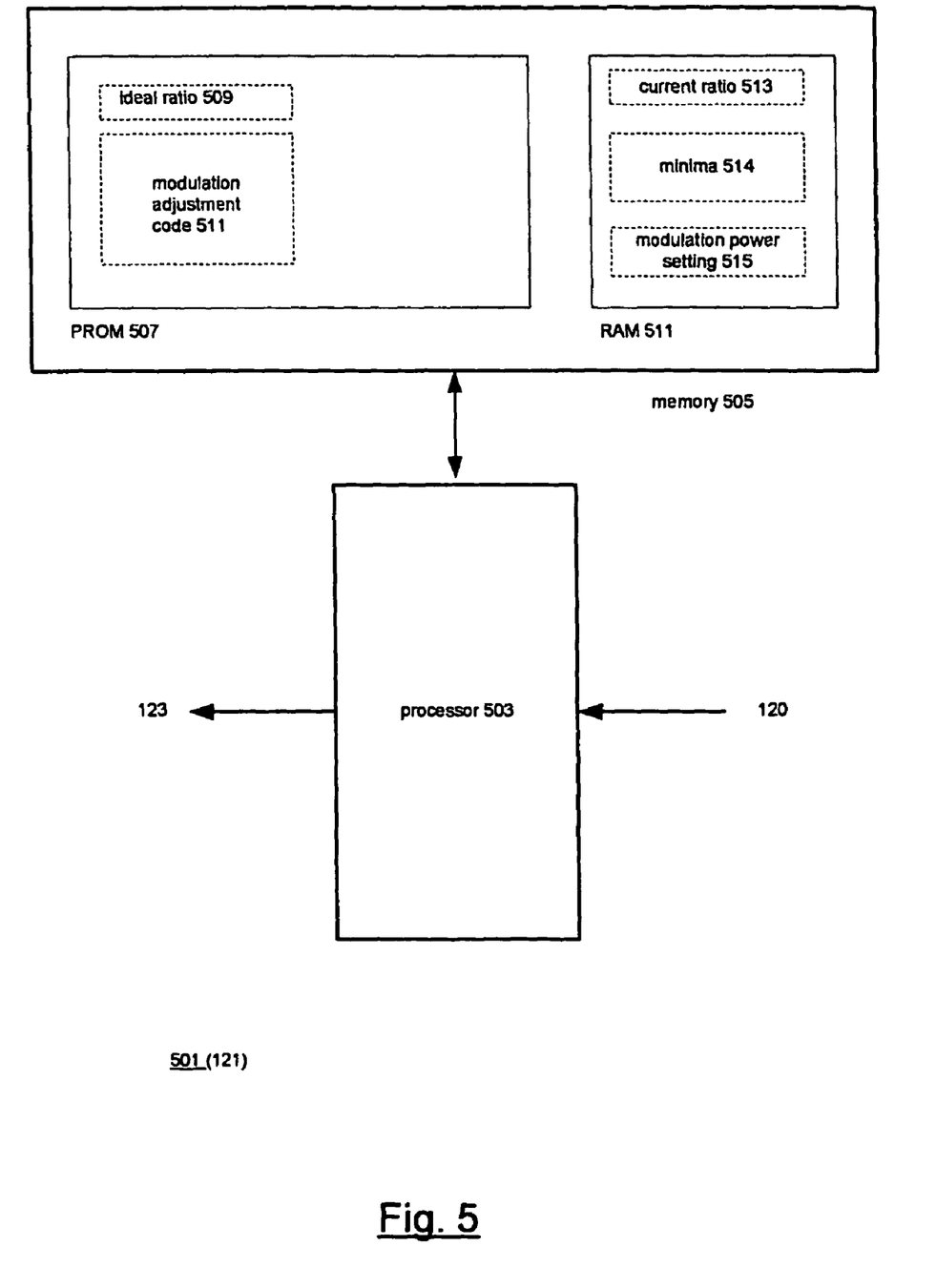
FIG. 5 is a block diagram of the frequency standard of FIG. 1 as modified to adjust its own modulation index.
Figure 6:
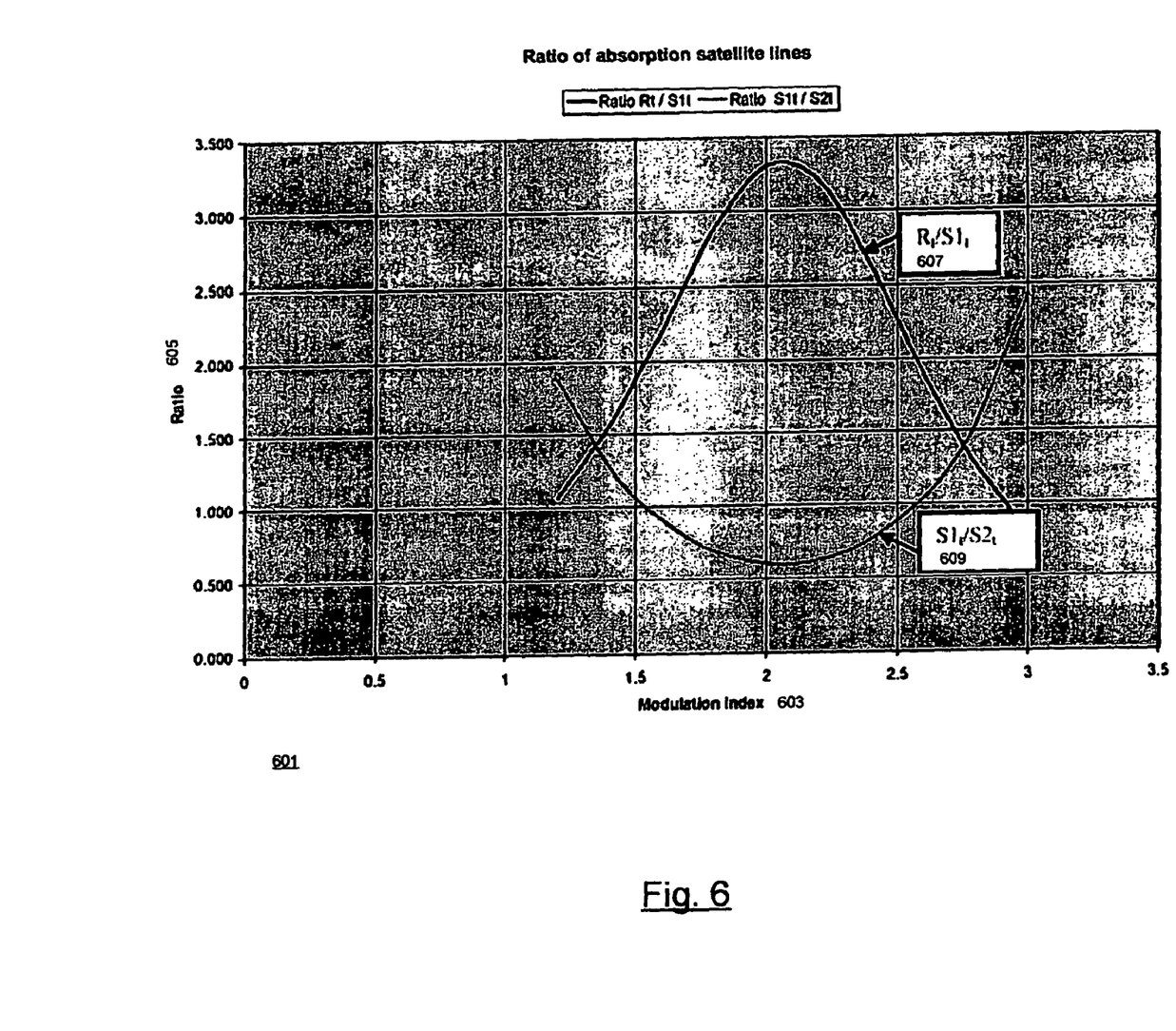
FIG. 6 shows the results of a theoretical calculation of the ratios of the various absorption lines as a function of the modulation index FIG. 7 provides the definition of the ratios $R_x/S1_x$ and $S1_x/S2_x$.
Figure 7:
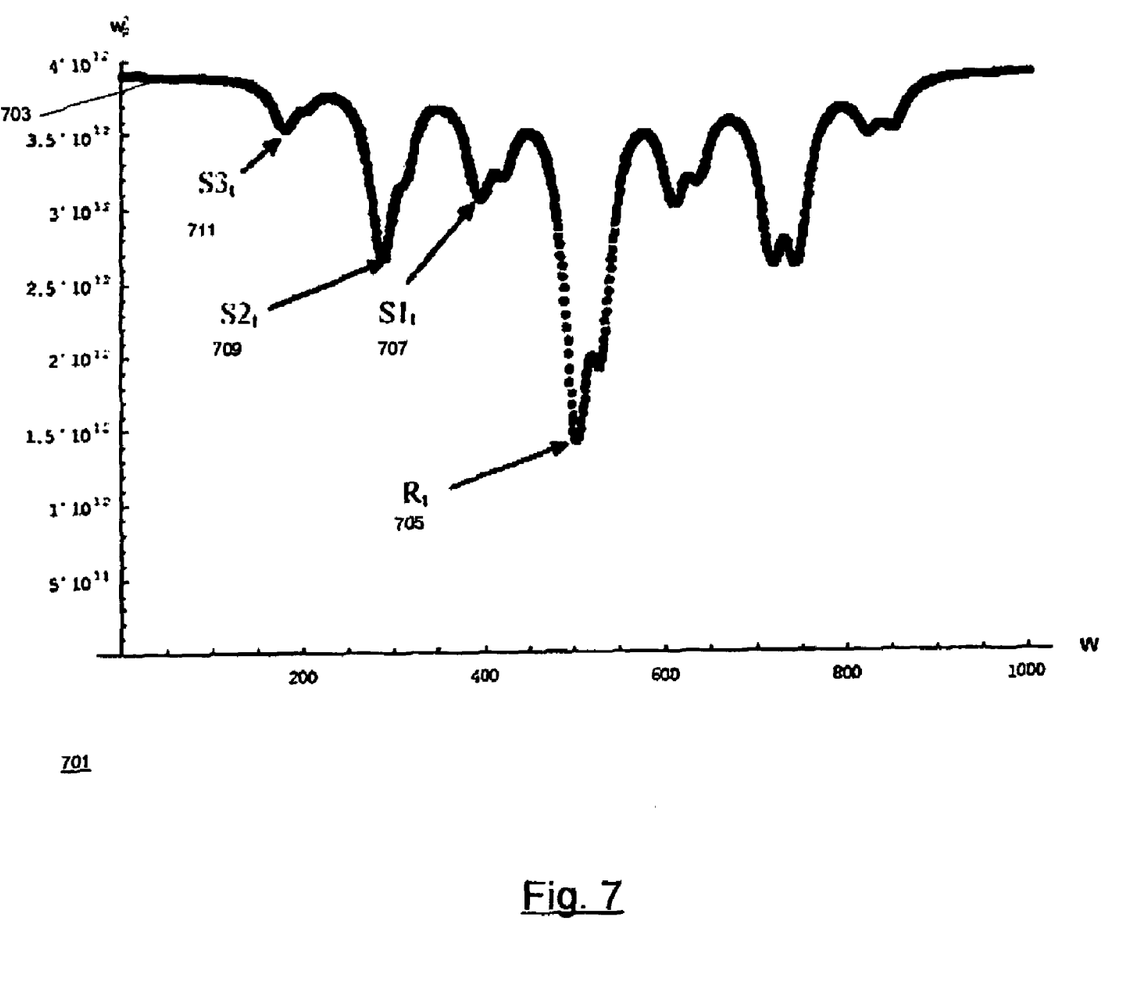

Automatic Adjustment of the Index of Modulation: FIGS. 5-7

As described above, manual adjustment of the index of modulation requires a human who can see a plot of the desired form of feedback signal 117 and a plot of the current form of the signal and adjust microwave generator 127 until the current size has the desired value. Automatic adjustment of the index of modulation can be done if a characteristic of feedback signal 117 exists from which control processor 121 can determine how the current modulation index needs to be adjusted to obtain the desired modulation index. An important aspect of the present invention is the discovery of such a characteristic and its use. The characteristic of feedback signal 117 which is employed in the invention to determine how the current modulation index needs to be adjusted is the following: the current modulation index varies with the ratio of R 219 to S1 217 or with the ratio of S1 217 to S2 215; thus, either of these ratios R/S1 or S1/S2 can be used by control processor 121 to adjust the power of the modulating signal and thereby the modulation index.

FIG. 6 shows a theoretically-determined graph 601 of the relationship between these ratios and the modulation index. The X axis of 603 of graph 601 represents the modulation index of laser light 105; the Y axis 605 represents a range of values of ratios. Curve 607 shows the value of the ratio R/S1 with respect to the modulation index; curve 609 shows the value of the ratio S1/S2 with respect to the modulation index. A difficulty with curves 607 and 609 is that they are ambiguous, i.e., curve 607 has a maximum at a modulation index of about 2.1 and curve 609 has a minimum at roughly the same modulation index. Consequently, a given ratio for either curve may indicate either a modulation index that is less than 2.1 or a modulation index that is greater than 2.1. In embodiments in which the laser needs be operated at modulation indexes greater than 2.1, the third satellite S3 214 can be used for disambiguation. The value of this satellite increases monotonically with the index of modulation, and consequently, the ratio S3/S2 indicates whether the modulation index represented by a value of S1/S2 or R/S1 is greater than or less than the modulation index 2.1.

FIG. 5 shows at 501 how control processor 121 can be set up to automatically adjust the modulation index of laser light 105. Control processor 101 as set up at 501 includes processor 503, which monitors digitized feedback signal 117 and provides control signals 123, and memory 505, which is read and written by processor 503. Memory 505 has two components: PROM 507, which is persistent, and contains the ratio 509 of R/S1 or S1/S2 that indicates the ideal modulation index, and modulation adjustment code 611, which compares the current ratio of R/S1 or S1/S2 with the ideal ratio 509 to determine whether the current modulation index needs adjusting. The values needed to determine the current ratio and the adjusted modulation setting are in RAM 511. Included are minima 514, which is a set of the most recent minima of feedback signal 117, with a value and a time for each minimum, current ratio 513, which is the ratio computed by code 511 from minima 514, and the modulation setting 515 required to adjust the index of modulation so that the current ratio is equal to the ideal ratio.

The adjustment algorithm may be the following:
1. processor 503 samples digital signal 120 for a period sufficient to include R 219, S1217, and S2 215; when processor 503 encounters a minimum, it saves the minimum together with its time of occurrence in minima 514.
2. Processor 503 executes modulation adjustment code 511. This code causes processor 503 to do the following:
   a. it reads minima 514 to locate the most recent values of R 219, S1217, or S2 215;
   b. it computes the current ratio 513 of R/S1 or S1/S2 from these minima;
   c. it compares the current ratio 513 with the ideal ratio; and
   d. it computes modulation power setting 515 based on the result of the comparison. If the modulation index is too high, the modulation power setting is reduced; if it is too low, the modulation power setting is increased.
3. Processor 503 provides modulation power setting 515 to microwave generator 127.

Processor 503 may only perform the above algorithm upon initialization of CPT standard 101, or if there is a tendency of the modulation signal's power to drift over time, processor 503 may perform the above algorithm at intervals to correct any drift. The algorithm may correct the modulation index in one execution, or several may be required to bring system 101 to the point where the current ratio equals the ideal ratio.

Theoretical Determination of the Form of Photodetector Output Signal 115 and of R/S1 and S1/S2: FIG. 7

Theoretical Background

The radiation amplitude of the "n"th sideband in the laser spectrum is described by the electric field $E_{on}$. We define the Rabi frequency proportional to this electric field as:

$$\omega_{Rnij} = (E_{on}/\hbar) \langle i| er \cdot e_\lambda | j \rangle \quad (1)$$

This definition is introduced in order to simplify notation and provide better insight into the physical mechanisms taking place in the laser radiation absorption process. In that equation, n is the sideband identification, $\hbar$ is Planck's constant over $2\pi$, and the terms between brackets represent the electric dipole matrix element characterizing the transition between levels i and j. It is generally written as $d_{ij}$ and gives the intensity of absorption.

Absorption is described by the differential equation derived from the Maxwell's field equation coupling the radiation electric field to the polarization of the Rb ensemble. The polarization of the Rb ensemble is calculated in the density matrix formalism through solving the appropriate rate equations for the level populations and the coherence existing in the system and introduced by the laser radiation. For sideband n and transitions between levels i and j an approximate calculation gives:

$$\frac{\partial \omega_{Rnij}}{\partial z} = \alpha_{ij} \mathrm{Im} \delta_{nij} \quad (2)$$

where $\alpha$ is the absorption coefficient defined as $$\alpha_{ij} = \left(\frac{\omega}{c\varepsilon_o \hbar} d_{ij}^2\right) n_{Rb} \quad (3)$$

All the effects of optical pumping and coherent population trapping are embedded into the term $\mathrm{Im}\delta_{nij}$, which means the imaginary part of the off diagonal density matrix element $\delta_{nij}$. It is the optical coherence created in the system by the radiation field sideband $E_n$ at the transition frequency corresponding to the transition between levels i an j. The transition probability for transition i to j is imbedded in the matrix dipole moment $d_{ij}$. On the other hand, the various terms in $\alpha_{ij}$ are defined as follows: $\omega$ is the average laser frequency, c is the speed of light, $\varepsilon_o$ is the permittivity of free space and $n_{Rb}$ is the Rb density.

If we neglect optical pumping from one level to another level of the ground state, $\mathrm{Im} d_{nij}$ is given by;

$$\mathrm{Im}\delta_{nij} = -\left(\frac{\omega_{Rnij}(\Gamma/4)}{(\Gamma/2)^2 + (\Omega_{nij})^2}\right) \quad (4)$$

where $\Omega_{nij}$ is $$\Omega_{nij} = \omega_n - \omega_{ij} \quad (5)$$

$\omega_n$ being the laser sideband angular frequency and $\omega_{ij}$, the angular frequency of the atomic transition.

In the theory, parameter $\Gamma$ is the decay rate from the excited state caused by Rb-buffer gas atom collisions. Unfortunately, there is always broadening from Doppler effect and in practice the absorption line width is larger than that expected just from the excited state decay rate. Actually the optical absorption line is a convolution of a Gaussian line shape (Doppler effect) and of a Lorentz line shape (decay from the excited state: Voigt profile). In that context the problem is intractable since the solution of the above differential equation would need to be integrated over all velocities. However, since in practice the line shape observed is closely Lorentzian, it is possible to approximate the situation by assuming a decay rate that gives an absorption line width the same as the one observed. This is the approach we use. In that case the differential equation can be integrated directly and gives Beer's law for absorption:

$$\omega_{Rn}(z) = \omega_{Rn}(0)\exp - \alpha_{ij}\left(\frac{(\Gamma/4)}{(\Gamma/2)^2 + (\Omega_{ijn})^2}\right)z \quad (6)$$

where $\Gamma$ is now a pseudo-decay rate giving a line width $v_{opt}$ equal to $(1/2\pi)\Gamma$, approximating the measured line width.

In this expression, $\omega_{Rn}(0)$ is the value of the Rabi frequency at the entrance of the cell. According to Eq. 1, it is proportional to the radiation electric field of the nth sideband. The voltage measured at photodetector 113 of apparatus 101 shown in FIG. 1 is proportional to the intensity of the radiation, thus to the square of the electric field of the radiation. Furthermore this voltage is proportional to the sum of all the radiation fields traversing the absorption cell, that is, all the sidebands. Consequently a summation must be made over all these sidebands n. Furthermore a summation must also be made as well on all the absorption lines <i|j> shown at 201. The result is:

$$(\omega_R(z))^2 = \sum_n (\omega_{Rn}(0))^2 \exp - 2\sum_{ij} a_{ij}\alpha\left(\frac{(\Gamma/4)}{(\Gamma/2)^2 + (\Omega_{ijn})^2}\right)z \quad (7)$$

We have also introduced the coefficient $a_{ij}$ that takes into account the actual transition probability shown at 129 in FIG. 1 and leaves $\alpha$ as a general term constant for all transitions.

Since $V_d$ is proportional to the square of the Rabi frequency this equation can be written as $$V_d = k\sum_n (\omega_{Rn}(0))^2 \exp - 2\sum_{ij} \alpha_{ij}\left(\frac{(\Gamma/4)}{(\Gamma/2)^2 + (\Omega_{ijn})^2}\right)z \quad (8)$$

Here k is a constant representing the transformation of light intensity (Rabi frequency) into voltage by the detection system.

Approximations Made

In the analysis optical pumping was not included. The theoretical results obtained, however, are in fairly good agreement with the experimental observations. It appears that although optical pumping is present to some extent, it introduces only a small distortion of the absorption spectrum The Constant to be Used The decay rate $\Gamma$: the physics behind this parameter was discussed above. In practice it is set such as to give good agreement with the line width observed experimentally, assuming a Lorentz line shape. The value used here for a cell containing a $N_2$—Ar buffer gas mixture at 10 Torr is $4\times10^9$ s$^{-1}$.

The absorption coefficient $\alpha$: from a previous calculation on the contrast of the transmission CPT signal it was found that at 65° C. good agreement was obtained between theory and experimental data with a value of $2.1\times10^{11}$ m$^{-1}$s$^{-1}$. This is the value we will use.

Transition probability $a_{ij}$: It is taken as that given in FIG. 2. It is 1 for three of the transitions and 0.2 for the transition $\mu$ to m.

The value of the Rabi frequency at the entrance of the cell $\omega_{Rn}(0)$. We set it for the carrier, for an unmodulated laser. We assume a value equal to $2\times10^6$. The size for the various sidebands is then obtained through a multiplication by the appropriate Bessel function value for the index of modulation chosen.

The Calculation

The calculation is done in Mathematica software with the constant chosen above. The results are shown in detail in FIG. 4. Only the $J_2$, $J_1$ and $J_o$ sidebands are used in the calculation.

Determination of the Index of Modulation

The index of modulation can readily be evaluated by plotting the ratios ($R_t/S1_t$), and ($S1_t/S2_t$). These terms are defined in FIG. 7. These ratios are plotted for the theoretical results in FIG. 6.

Conclusion

The foregoing Detailed Description has disclosed to those skilled in the relevant technologies how to use an alkali metal vapor cell to determine the modulation index of a frequency-modulated laser source and how to apply this technique to CPT frequency standards and thereby make it possible to determine the laser source's modulation index without removing the laser source from the CPT frequency standard. The Detailed Description has further disclosed the best modes presently known to the inventor of practicing his techniques and of applying them to CPT frequency standards.

It will be immediately apparent to those skilled in the relevant technologies that the technique for determining the modulation index can be used in any situation in which the frequency modulation produces a pattern in the absorption spectrum of the alkali metal vapor cell from which the modulation index can be determined. The pattern in the absorption spectrum can be detected using any available technique. The manner in which the modulation index is determined from the pattern will of course depend upon the characteristics of the pattern. The actual computations made using the characteristics of the pattern depend upon the reason the modulation index is of interest.

In CPT frequency standards, the technique may be used to calibrate the laser source to a desired modulation index. Pattern detection may be done visually and the calibration may be done by hand or pattern detection and calibration may be done automatically. Automatic detection and calibration may be done by a device exterior to the CPT frequency standard or by a control processor that is part of the CPT frequency standard. Calibration may be done when the CPT frequency standard is built, when it is initialized, or during normal operation.

For all of the foregoing reasons, the Detailed Description is to be regarded as being in all respects exemplary and not restrictive, and the breadth of the invention disclosed herein is to be determined not from the Detailed Description, but rather from the claims as interpreted with the full breadth permitted by the patent laws.

What is claimed is:

1. A method implemented in a CPT frequency standard of using an alkali metal vapor cell to determine the modulation index of a frequency-modulated laser source, the method comprising the steps of:
    modulating the laser source at a given power and a given frequency;
    passing the laser light from the modulated laser source through the cell; and
    determining the modulation index of the laser source from the absorption spectrum of the alkali metal vapor,
the determined modulation index being subsequently employed to calibrate the laser source to run at a desired modulation index.

2. The method set forth in claim 1 wherein:
    the absorption spectrum includes a plurality of minima; and
    the modulation index is determined from the minima.

3. The method set forth in claim 2 wherein:
    a photodetector receives the laser light that passes through the cell; and
    the minima are measured using the output of the photodetector.

4. The method set forth in either claim 2 or claim 3 wherein:
    in the step of determining the modulation index, the modulation index is determined using ratios of the minima.

5. The method set forth in claim 4 wherein:
    the modulation index is ambiguously determined using a ratio of first ones of the minima and disambiguated using a ratio of second ones of the minima.

6. The method set forth in claim 4 wherein:
    the minima include a primary minimum and a first satellite minimum; and
    the modulation index is determined using the ratio of the primary minimum and the first satellite minimum.

7. The method set forth in claim 6 wherein:
    the minima include a second satellite minimum and a third satellite minimum;
    the determination of the modulation index using the ratio of the primary minimum and the first satellite minimum is ambiguous; and
    in the step of determining the modulation index, the ratio of the second satellite minimum and the third satellite minimum are employed to disambiguate the modulation index determined using the ratio of the primary minimum and the first satellite minimum.

8. The method set forth in claim 4 wherein:
    the minima include a first satellite minimum and a second satellite minimum; and
    the modulation index is determined using the ratio of the first satellite minimum and the second satellite minimum.

9. The method set forth in claim 8 wherein:
    the minima include a third satellite minimum;
    the determination of the modulation index using the ratio of the first satellite minimum and the second satellite minimum is ambiguous; and
    in the step of determining the modulation index, the ratio of the second satellite minimum and the third satellite minimum are employed to disambiguate the modulation index determined using the ratio of the first satellite minimum and the second satellite minimum.

10. The method set forth in claim 1 wherein:
    in the step of modulating the laser source, the given frequency is approximately one half that of the hyperfine separation of the alkali metal vapor in the cell.

11. A method of calibrating a frequency-modulated laser source in a CPT frequency standard to run at a desired modulation index, the light from the laser source passing through an alkali metal vapor cell in the CPT frequency source and the method comprising the steps of:
    1. modulating the laser source at a given power and a given frequency;
    2. determining the modulation index of the laser source from the absorption spectrum of the alkali metal vapor; and
    3. repeating steps 1-2 with different given powers until the determined modulation index is the desired modulation index.

12. The method set forth in claim 11 further comprising the step of:
    operating the laser source thereafter at the given modulation power that produces the desired modulation index.

13. The method set forth in claim 12 wherein:
    the CPT frequency standard automatically performs the method of claim 12.

14. The method set forth in claim 13 wherein:
    the method is performed upon initialization of the CPT frequency standard.

15. The method set forth in claim 13 wherein:
    the method is performed during normal operation of the CPT frequency standard.

* * * * *